United States Patent [19]

Wong

[11] Patent Number: 5,508,621

[45] Date of Patent: Apr. 16, 1996

[54] FOUR-TERMINAL OHMMETER APPARATUS

[75] Inventor: Warren H. Wong, Seattle, Wash.

[73] Assignee: Fluke Corporation, Everett, Wash.

[21] Appl. No.: 390,944

[22] Filed: Feb. 21, 1995

Related U.S. Application Data

[63] Continuation of Ser. No. 145,076, Oct. 29, 1993, abandoned.

[51] Int. Cl.⁶ ..................................................... G01R 27/26
[52] U.S. Cl. ........................... 324/549; 439/669; 324/713
[58] Field of Search ..................................... 439/669, 825; 324/549, 691, 713, 715, 115, 116, 149

[56] References Cited

U.S. PATENT DOCUMENTS

| | | | |
|---|---|---|---|
| 1,654,278 | 12/1927 | Yaxley | 439/669 |
| 1,819,040 | 8/1931 | Schellenger | 439/669 |
| 2,569,098 | 9/1951 | Hendricks et al. | 324/713 |
| 2,583,130 | 1/1952 | Wrolson et al. | 324/713 |
| 2,819,448 | 1/1958 | Neeper | 324/149 |
| 2,839,723 | 6/1958 | Armond | 324/115 X |
| 2,857,570 | 10/1958 | Simpson . | |
| 3,068,403 | 12/1962 | Robinson | 324/149 |
| 4,934,367 | 6/1990 | Daglow et al. | 439/669 |

*Primary Examiner*—Maura K. Regan
*Attorney, Agent, or Firm*—Dellett and Walters

[57] ABSTRACT

A test lead set for a four-terminal ohmmeter comprises separate conductor pairs with one conductor of each pair connected to a source while the other conductor of the same pair is connected to a meter. The conductor pairs, which are received within separate insulating shrouds, are provided at their remote ends with bifurcated clips having jaws for making individual connections between the conductor leads and a terminal of a device under test. The test lead set is coupled to the measuring instrument by banana-type plugs having separated conductive portions for engaging contacts within instrument receptacles so that separate connections to the source and measuring device can be maintained. The instrument receptacles are backwards compatible with a conventional, two-terminal, test lead set.

5 Claims, 3 Drawing Sheets

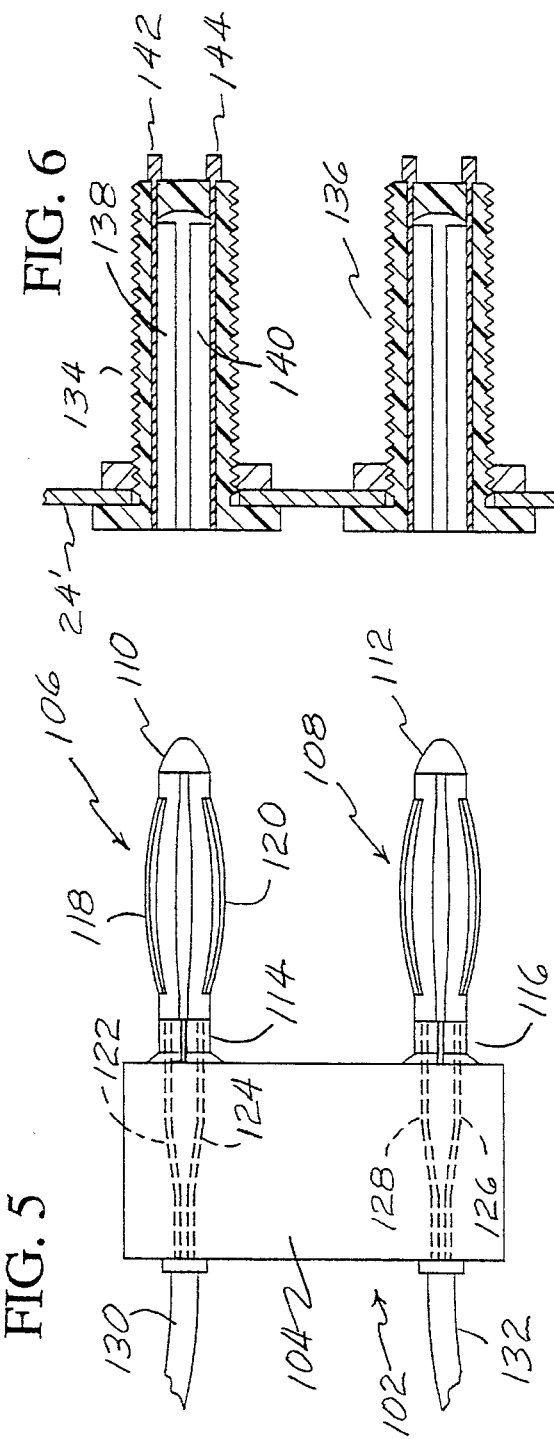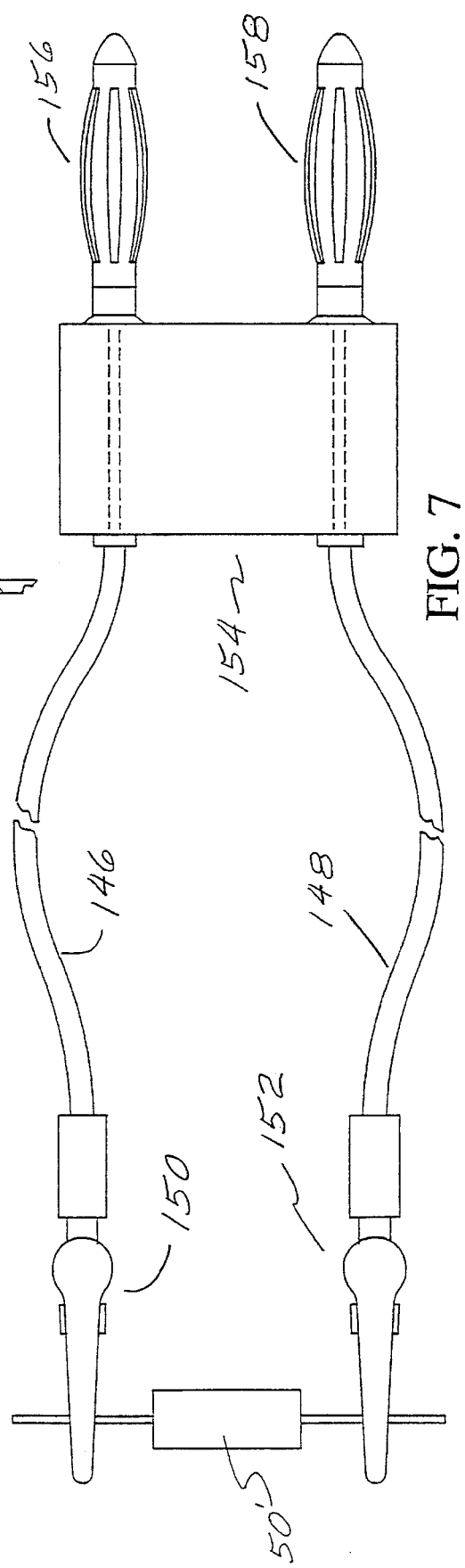

FOUR-TERMINAL OHMMETER APPARATUS

This is a continuation of application Ser. No. 08/145,076, filed on Oct. 29, 1993, now abandoned.

BACKGROUND OF THE INVENTION

The present invention relates to resistance measuring apparatus and particularly to simplified and foolproof instrumentation for implementing a four-terminal ohmmeter.

In a simple circuit for resistance measurement, the ratio of the voltage across a pair of instrument terminals to the current flowing therethrough is determined. Since the actual device under test may be at some distance from the measuring instrument, the instrument inherently measures a resistance including a variable value accounting for the intervening test leads. A more accurate determination can be provided by a four-terminal ohmmeter wherein the current and voltage factors are separated.

Referring to FIG. 1, schematically illustrating a four-terminal ohmmeter, a source (i.e., current source) 10 is connected by test leads represented by resistances 12 and 14 to opposite terminals of an unknown resistance 16. A sensing means, here comprising voltmeter 18, is coupled separately via test leads here represented by resistances 20 and 22 to the same terminals of the unknown resistance 16. It is understood that voltmeter 18 is customarily a very high impedance device and therefore the current through and the voltage drop across resistances 20 and 22 are very small. Therefore, the only substantial current flowing through unknown resistance 16 is the predetermined current from source 10, while the voltage across unknown resistance 16 is accurately measured by voltmeter 18, wherein the value of the unknown resistance is equal to the aforementioned voltage divided by the aforementioned current.

In use, the four-terminal ohmmeter requires two pairs of test leads, i.e., the pair 12, 14 from the source, and the separate pair 20, 22 from the sensing meter. Test probes, clips, or the like at the ends of these test leads are applied as closely as possible to the device the resistance of which is to be measured.

While the foregoing four-terminal method is accurate, it is awkward in its implementation and can be intimidating to personnel not familiar with the device.

It is accordingly an object of the present invention to provide an improved resistance measuring apparatus for making highly accurate resistance measurements in an automatic and foolproof manner.

It is another object of the present invention to implement a four-terminal ohmmeter in a manner that is easily employed and backwards compatible with conventional test lead sets.

SUMMARY OF THE INVENTION

In accordance with the present invention, a four-terminal ohmmeter is provided with a test lead set which is operable in the same manner as a conventional pair of test leads for a two-terminal device. The test lead set comprises first and second pairs of conductors which are desirably provided with separate shrouds wherein opposite terminals of the source and sensing means within the ohmmeter instrument are connected to conductors of separate pairs. Conductive means at the remote ends of the conductor pairs include a first means for conjointly connecting a first pair of conductors to a first terminal of the device under test, and second means for conjointly connecting the second pair of conductors to a second terminal of the device under test. The means for conjointly connecting the respective pairs of conductors to the device under test preferably comprise removable clips for making separate connections at a given terminal of the device under test.

The conductors of a given pair connect to a common plug having separate connector means engageable with an instrument socket so that conductors of a conductor pair are coupled to respective contacts in the socket leading to one side of the source and one side of the sensing means. If it is decided that less accurate measurements are satisfactory, a conventional pair of test leads may be employed. A plug for the conventional test leads is alternatively engageable with the same receptacle, making connection with both contacts thereof, and establishing a more simplified ohmmeter circuit.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 5 is a plan view of a plug set according to an alternative embodiment of the present invention;

FIG. 6 is a cross-sectional view of a pair of sockets for receiving the FIG. 5 plug set; and FIG. 7 is a plan view of a conventional test lead set which is backwards compatible with the apparatus according to the present invention.

DETAILED DESCRIPTION

Figure 2:
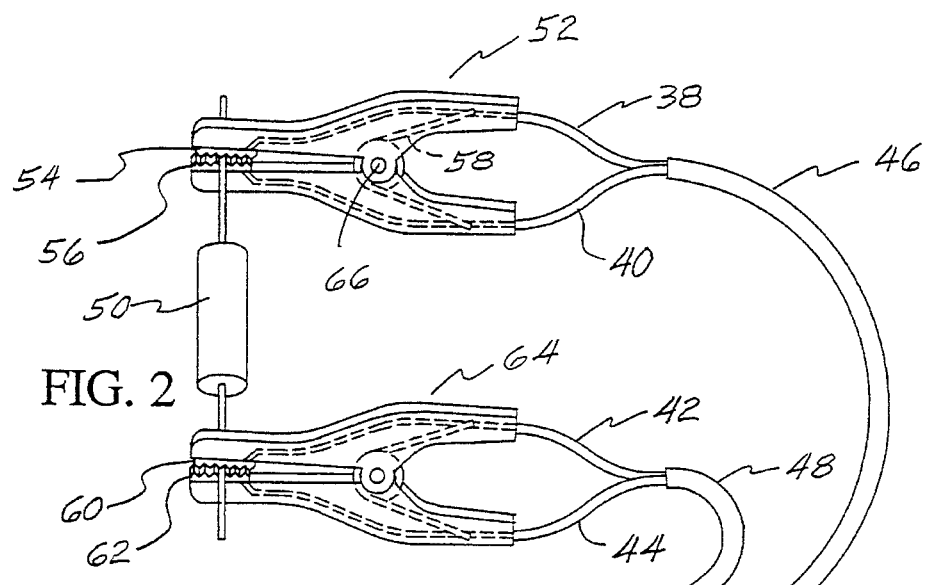
FIG. 2 is a perspective view, partially broken-away, of apparatus for making resistance measurements according to the present invention.
Figure 1:
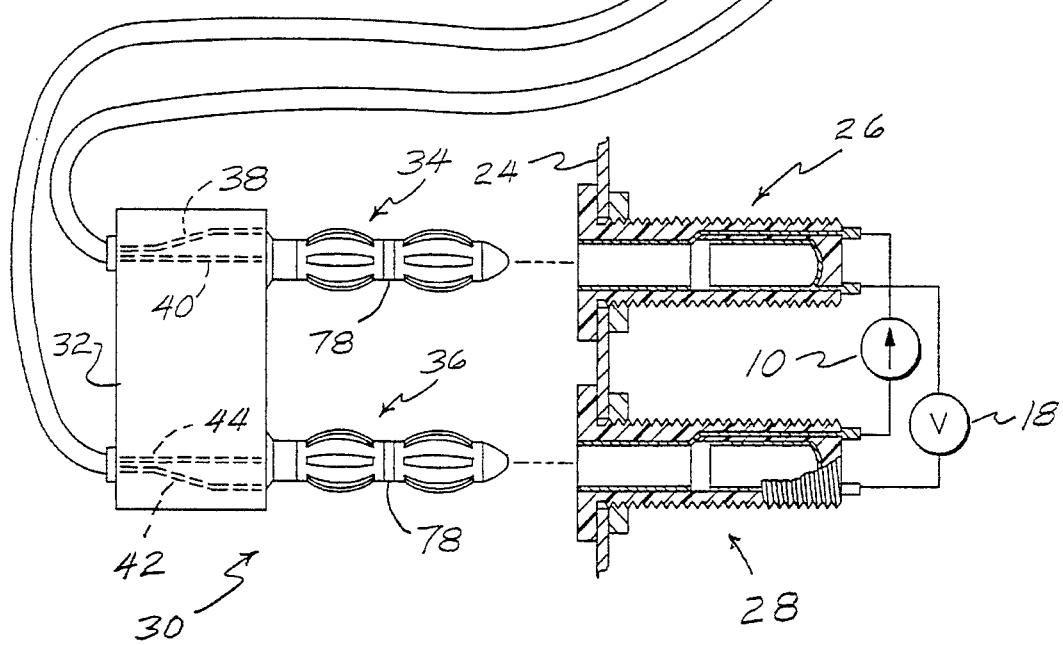
FIG. 1 is a schematic diagram of a circuit for a four-terminal ohmmeter.
Figure 1:
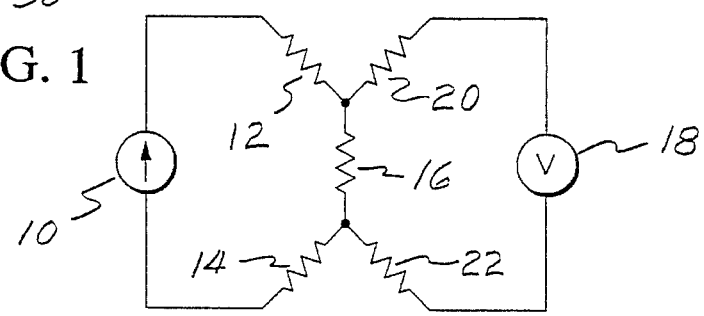

Referring to the drawings and particularly to FIG. 2, a four-terminal ohmmeter device in accordance with the present invention includes within the instrument case a current source 10 and a high-impedance input voltmeter 18 that are interconnected with first and second receptacles, 26 and 28 secured to instrument front panel 24 and accessible by plug set 30.

Plug set 30 includes a pair of parallel, spaced connector means 34 and 36 each comprising a "banana" plug having longitudinally separated conductive portions for making connection respectively with longitudinally separated contacts within parallel, spaced receptacles 26 and 28. The connector means 34 and 36 are suitably joined by an insulating bar 32 whereby they are simultaneously insertable into the receptacles 26 and 28.

The longitudinally separated conductive portions of plug 34 are connected to a first pair of conductors 38 and 40 of a test lead set, while the longitudinally separated conductive portions of plug 36 are similarly connected to a second pair of leads 42 and 44 of the test lead set. Leads 38 and 40, which are each individually insulated, are also covered, over a major portion of the length thereof, with an insulating tubular shroud 46 such that the first pair of leads 38, 40 appear to the user to comprise a single test lead. Leads 38 and 40 are connected to first conductive means 52 for conjointly connecting the first pair of conductors to a first terminal or lead of a resistor 50, the latter comprising the device under test. The conductive means 52 comprises a removable, bifurcated clip having separate conductive jaws 54 and 56 connected respectively to the aforementioned leads 38 and 40. The clip is formed by a pair of opposed arms pivotably connected with pin 66. Aside from when the jaws are forced into contact with one another by interior coil spring 58, the jaws 54 and 56 are insulated from one another by the body of clip 52, suitably formed of a plastic material. When the clip is opened by depressing the handles at the rear of the clip toward one another, the jaws open such that the end pigtail lead of resistor 50 is insertable therebetween and forms the only conductive path between jaws 54 and 56.

The remaining pair of conductors 42, 44 of the test lead set are similarly connected to conductive means 64 including jaws 60 and 62 for conjointly contacting a second terminal or lead of resistor 50. The conductive means 64 also comprises a removable, bifurcated clip, identical in construction to clip 52. Leads 42, 44, which are separately insulated, are covered by a tubular insulating shroud 48 so as to appear as an individual test lead so far as the operator is concerned.

It will be seen the measuring apparatus as illustrated in FIG. 2 provides a four-terminal ohmmeter with a test lead set that is much easier to handle than a conventional arrangement wherein four separated leads must be connected to the device under test. The operator merely engages the device under test with the clips 52 and 64 and no mistake is possible regarding correct application of the test leads. As will hereinafter become more evident, the source 10 provides current through conductors 38 and 42 to the upper jaws 54 and 60 of clips 52 and 64, while the voltage across the device-under-test 50 is measured by voltmeter 18 coupled to the lower jaws 56 and 62 of the clips by conductors 40 and 44. Assuming the value of current provided by source 10 in a given instrument setting is known, voltmeter 18 can obviously be calibrated in ohms. As also hereinafter more fully described, the ohmmeter is "backwards compatible" with an ordinary test lead set for making less accurate resistance measurements. Although plugs 34 and 36 are joined by insulating bar 32 as a matter of convenience, it is apparent they need not be but can be plugged individually into the receptacles 26 and 28.

Figure 3:
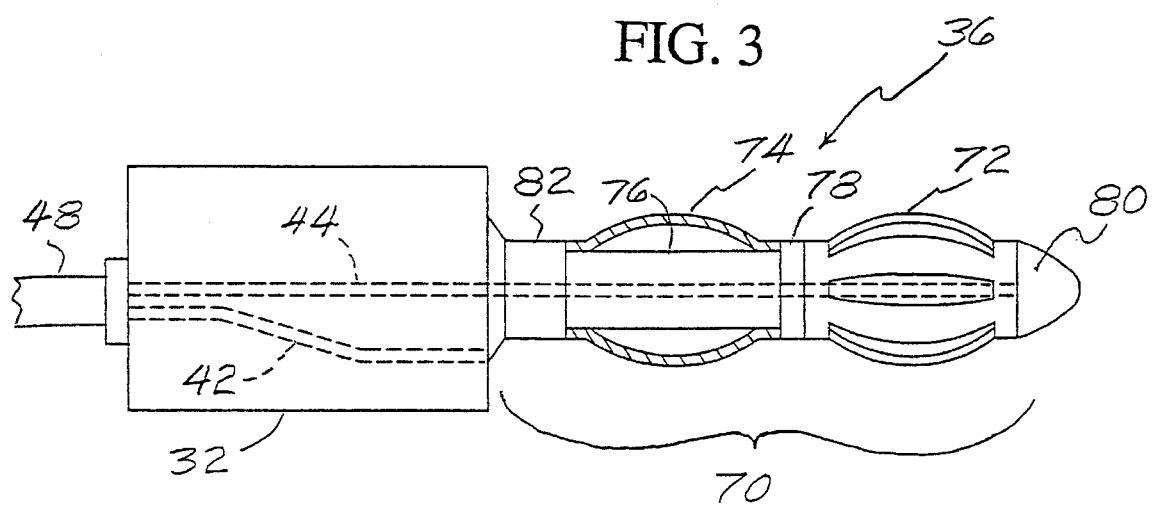
FIG. 3 is a side view, partially in cross-section, of a connector plug according to the present invention.

Referring now to FIG. 3, depicting plug 36 in greater detail, the plug comprises an elongated tip 70 supported in this instance by insulating block 32 that also holds a second plug, although a cylindrical handle can be substituted for supporting an individual plug. The plug is generally tubular and is of the "banana" type comprising, in this case, split sleeve 72 toward the distal end of tip 70 and split sleeve 74 closer to the bar 32. The metal split sleeves 72, 74 form leaves that bow radially outwardly as shown for providing spring contact with a banana receptacle or jack as hereinafter more fully described.

The split sleeves 72, 74 are mounted upon and may be rotatable with respect to an insulating central rod or shaft 76 extending outwardly from bar 32. The insulating rod 76 is centrally provided with a radial flange 78 for separating and insulating sleeves 72 and 74 from one another, sleeve 72 being captured between flange 78 and tapered metal tip end 80 at the distal end of rod 76, while sleeve 74 is captured between flange 78 and metal ferrule 82 adjacent block 32. Conductor 42 is connected to ferrule 82 and therefore makes continuous connection with sleeve 74. Conductor 44 extends coaxially within insulating rod 76 and connects to metal tip end 80 at the distal end of the rod for making continuous connection with sleeve 72. The plug is thus provided with longitudinally separated conductive portions adapted for making separate connection within a receptacle or jack as illustrated in FIG. 4.

Figure 4:
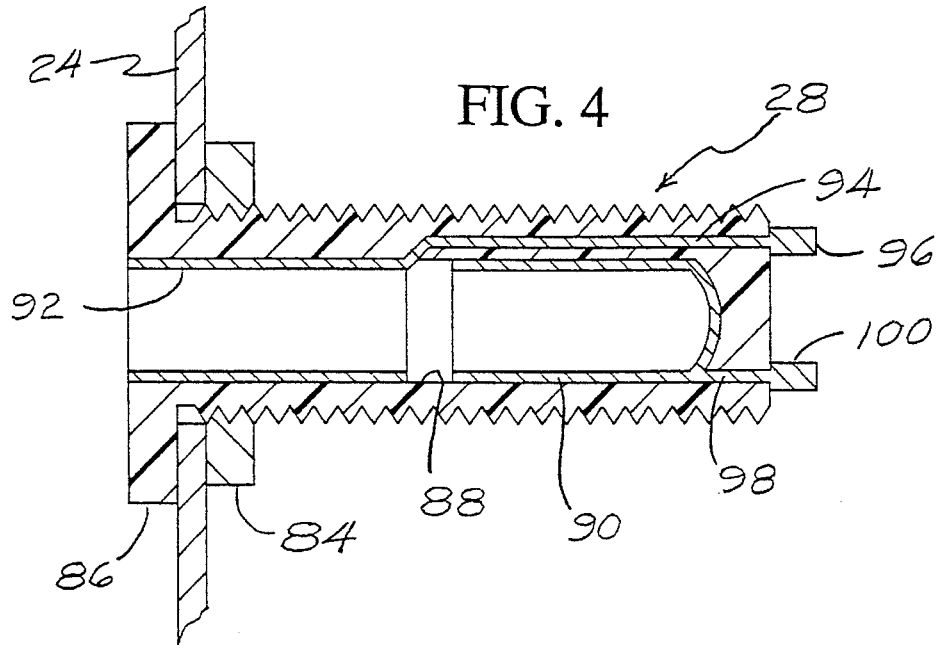
FIG. 4 is a longitudinal cross-sectional view of receptacle means comprising a socket for receiving the FIG. 3 plug.

Referring particularly to FIG. 4, receptacle or jack 28 is generally tubular in shape and is exteriorly formed of insulating material and threaded to receive nut 84 employed for drawing up the outer flanged end 86 of the receptacle against panel 24. The receptacle 28 forms a socket for matingly receiving tip 70 of plug 36 and is provided at the forward end of its longitudinal bore 88 with a forward metal sleeve 92 and a rearward sleeve 90 that are separated from one another along the bore and adapted to receive and compress the outwardly bowed leaves of split sleeves 72 and 74 of plug 36 in FIG. 3. Sleeve 92 is open on both ends and is connected by a conductor 94 within the insulating body of receptacle 28 to terminal tip 96 at the rear end of the receptacle coupled to source 10. Sleeve 90 is open at the forward end thereof, but suitably closed at the end wall of bore 88 where it is provided with a conductor 98 leading to a terminal tip 100 at the rear end of the receptacle adapted for connection to voltmeter 18. It will be seen the sleeves 90 and 92 form a longitudinally separated pair of contacts that are insulated from one another.

Although only plug 36 and receptacle 28 are above described in detail, it will be understood that receptacle 26 and mating plug 34 are identical in construction. When the respective plugs are inserted in the corresponding sockets, the circuit is completed for providing four-terminal ohmmeter operation.

Referring to FIGS. 5 and 6, illustrating a second embodiment according to the present invention, a plug set 102 comprises an insulating block 104 supporting tubular connector means comprising banana-type plugs 106 and 108 spaced by insulating block 104 in parallel relation to one another. As in the previous embodiment, each plug is supported by a longitudinal insulating rod extending from block 104 but in this case provided with insulating tip ends 110 and 112 which capture split sleeves between the tip ends and split ferrules 114, 116 secured to block 104. The split sleeves in this case are divided into longitudinally extending, radially separated paths; for instance plug 106 comprises a first connector portion half 118 comprising plural, outwardly bowing leaves, and a similar second connector portion half 120 provided with leaves and radially spaced and insulated from the first portion, both halves being non-rotatably secured to the underlying insulating rod at the ends thereof adjacent tip end 110 and split ferrule 114. Conductors 122, 124 of a first pair of conductors are connected respectively to the halves of plug 106, while the conductors 126, 128 of a second pair are similarly connected to the halves of plug 108. The conductor pairs are received within shrouds 130 and 132 which extend from block 104 to removable clips of the same type illustrated at 52 and 64 in FIG. 2.

The plug set 102 is adapted to provide connection with receptacles 134 and 136 in FIG. 6, the receptacles being secured to panel 24' in substantially the manner hereinbefore described. Each of the receptacles 134, 136 is exteriorly formed from insulating material and is provided with contacts within the interior bore thereof that have nearly the same length as the receptacle bore, but which are separated to remain mutually insulated. Longitudinal contact 138 is semi-cylindrical in nature, extending for approximately 160° around one side of the receptacle's interior bore, while adjacent contact 140, disposed at the opposite side of the bore, is spaced from contact 138, and is also semi-cylindrical, extending approximately 160° around the inside of the bore. The contacts 138 and 140 are oriented in a fashion to make separate connection with respective plug halves 118, 120 of plug 106 in FIG. 5. Contacts 138 and 140 are brought out to separate end terminals 142 and 144 for connection to one terminal of a source such as source 10 in FIG. 2, and one terminal of a sensing means or voltmeter as indicated at 18 in FIG. 2.

The construction of receptacle 136 is substantially identical to that of receptacle 134, and receptacle 136 is positioned to receive plug 108 in the same manner as plug 106 is received in receptacle 134. In the embodiment of FIGS. 5 and 6, the insulating bar 104 takes on an additional function of maintaining the proper orientation of the plugs 106, 108 relative to the receptacle 134, 136 whereby connector half 118 always engages contact 138, while connector half 120 always engages contact 140. The banana-type plug configuration employing leaves that bow outwardly ensures good electrical connection between the plugs and the mating receptacles.

Referring now to FIG. 7, a conventional test lead set is illustrated with which the apparatus according to the present invention is "backwards compatible". The test lead set comprises insulated test leads 146 and 148 provided at first ends thereof with conventional alligator clips 150 and 152 adapted for engaging the end leads of a resistor 50'. The test leads 146 and 148 are coupled via insulating block 154 to spaced, conventional banana plugs 156 and 158. The banana plugs 156, 158 are spaced to mate with either the pair of receptacles 26, 28 in FIG. 2, or the pair of receptacles 134, 136 in FIG. 6. In either case, the outwardly bowed, split sleeve of the banana plug engages the interior contacts of the receptacle but does not engage these contacts separately. That is, banana plug 156 is adapted to have substantially the same length as plug 34 in FIG. 2 whereby connection is made with both the longitudinally separated contacts within receptacle 26, or both radially separated contacts within receptacle 134 of FIG. 6. Stated differently, the overall length of each plug 34, 36, 106 or 108 is preferably the same as the length of a standardly used banana plug. When the plug set 154 is thus employed, first terminals of the source 10 and detector 18 are connected together while second terminals of the source 10 and detector 18 are similarly connected together because of the linear extent of the plugs in FIG. 7, whereby a conventional ohmmeter circuit is completed rather than a four-terminal ohmmeter. Thus, if less accuracy is satisfactory, or if the device under test is unsuitable for four-terminal ohmmeter measurement, the ordinary test lead set of FIG. 7 may be utilized. In such instance, insulating bar 154 need not be included but separate plugs 156 and 158 can be used.

In the apparatus according to the present invention, the sensing device or voltmeter 18 is preferably connected to the receptacle terminals connected to the rear receptacle contacts, e.g. contact 90 in FIG. 4. It is preferred that the sensor contact be less accessible inasmuch as a high potential may be unintentionally applied thereto by internal instrument circuitry should the sensor contacts be left unconnected. However, depending upon the internal configuration of internal protection circuitry, it can be advisable to reverse the positions of the source and sensor contacts for optimum safety.

Although banana-type plugs and receptacles have been described as forming a part of the present apparatus and are preferred for reasons of convenience and compatibility with other test instruments and test leads, alternative double-contact connectors can be substituted. For instance, double-contact phone plugs with mating jacks may be employed if so desired.

While plural embodiments of the present invention have been shown and described, it will be apparent to those skilled in the art that many other changes and modifications may be made without departing from the invention in its broader aspects. The appended claims are therefore intended to cover all such changes and modifications as fall within the true spirit and scope of the invention.

I claim:

1. Apparatus for making resistance measurements, said apparatus comprising:

an instrument including a source and a sensing means, said instrument being further provided with a first double contact receptacle and a second double contact receptacle, wherein opposite terminals of said source are brought out respectively to a first contact of said first receptacle and a first contact of said second receptacle, and wherein opposite terminals of said sensing means are brought out respectively to a second contact of said first receptacle and a second contact of said second receptacle, a test lead set comprising pairs of conductors, each pair terminating at first ends thereof in a unitary connector removably engageable with a said receptacle for making separate connections between the conductors of a pair and the first and second contacts of a said receptacle, such that a first conductor of a pair becomes connected to a first contact of a receptacle while the second conductor of the same pair becomes connected to a second contact of the receptacle, said connector having separate conductive portions insulated from one another but physically part of the same connector structure, and means at ends of said conductors remote from said instrument for connecting a first pair of said conductors to a first terminal of a resistance under test, and for connecting the second pair of said conductors to a second terminal of said resistance under test, wherein said receptacles and connectors are matingly tubular and are provided with intermediate insulation between longitudinally separated conductive parts thereof for enabling separate connections at longitudinally separated locations.

2. The apparatus according to claim 1 wherein said connectors comprise banana plugs.

3. The apparatus according to claim 1 wherein said receptacles are alternatively adapted to receive elongate connectors which are conductive therealong for making simultaneous connection with both contacts of a receptacle at longitudinally separated locations, said elongate connectors being provided with individual conductors for making single connections to respective terminals of a resistance under test.

4. Apparatus for making resistance measurements, said apparatus comprising:

an instrument including a source and a sensing means, said instrument being further provided with a first double contact receptacle and a second double contact receptacle, wherein opposite terminals of said source are brought out respectively to a first contact of said first receptacle and a first contact of said second receptacle, and wherein opposite terminals of said sensing means are brought out respectively to a second contact of said first receptacle and a second contact of said second receptacle, a test lead set comprising pairs of conductors, each pair terminating at first ends thereof in a unitary connector removably engageable with a said receptacle for making separate connections between the conductors of a pair and the first and second contacts of a said receptacle, such that a first conductor of a pair becomes connected to a first contact of a receptacle while the second conductor of the same pair becomes connected to a second contact of the receptacle, said connector having separate conductive portions insulated from one another but physically part of the same connector structure, and means at ends of said conductors remote from said instrument for connecting a first pair of said conductors to a first terminal of a resistance under test, and for connecting the second pair of said conductors to a second terminal of said resistance under test, wherein said receptacles and connectors are matingly tubular and are provided with intermediate insulation between radially separated conductive parts thereof for enabling separate connections at radially separate connections at radially separated locations.

5. The apparatus according to claim 4 wherein said receptacles are alternatively adapted to receive connectors which are conductive therearound for making simultaneous connection with both contacts of a receptacle at radially separated locations, said connectors being provided with individual conductors for making single connections to respective terminals of a resistance under test.

* * * * *